United States Patent [19]

Benjaminson

[11] Patent Number: 4,661,785

[45] Date of Patent: Apr. 28, 1987

[54] BALANCED FEEDBACK OSCILLATORS

[75] Inventor: Albert Benjaminson, Arlington, Va.

[73] Assignee: S. T. Research Corporation, Newington, Va.

[21] Appl. No.: 736,883

[22] Filed: May 22, 1985

[51] Int. Cl.⁴ .............................................. H03B 5/36
[52] U.S. Cl. ..................................... 331/109; 331/56; 331/116 R; 331/158
[58] Field of Search ............... 331/109, 116 R, 108 D, 331/158, 183, 56, 117 R, 167, 168, 116 FE, 117 FE

[56] References Cited

U.S. PATENT DOCUMENTS

| | | | |
|---|---|---|---|
| 2,742,573 | 4/1956 | Seeley | 331/158 X |
| 3,569,865 | 3/1971 | Healy, III | 331/159 |
| 3,571,754 | 3/1971 | Healy, III | 331/116 R |
| 3,824,495 | 7/1974 | Gerum | 331/116 R |
| 3,836,873 | 9/1974 | Healey, III et al. | 331/116 R |
| 3,878,481 | 4/1975 | Healy, III | 331/105 |
| 3,911,378 | 10/1975 | Buchanan | 331/116 R |
| 3,996,530 | 12/1976 | Feistel et al. | 331/116 R |
| 4,358,742 | 11/1982 | Ferriss | 331/158 |

FOREIGN PATENT DOCUMENTS

52-38865  3/1977  Japan .................................. 331/158

Primary Examiner—Siegfried H. Grimm
Attorney, Agent, or Firm—Schwartz, Jeffery, Schwaab, Mack, Blumenthal & Evans

[57] ABSTRACT

The oscillator circuit comprises an amplifier having a pair of inputs, a positive feedback path producing a positive feedback ratio to one of the inputs, and a negative feedback path including a series resonant circuit producing a negative feedback ratio to the other of the inputs. The positive and negative feedback paths are independent such that the current in each of the paths can be adjusted independently. In this manner, a high Q multiplier effect is achieved. Also, the circuit has an output path which is separate from the input path so that a high output signal level can be achieved while maintaining a low current through the series resonant circuit.

18 Claims, 6 Drawing Figures

BALANCED FEEDBACK OSCILLATORS

The U.S. Government has a paid up license in this invention and the right in limited circumstances to require the patent owner to license others on reasonable terms as provided for by the terms of Contract No. DAAK 20-84-C-0386 awarded by Department of Army.

BACKGROUND OF THE INVENTION

1. Field of the Invention

The present invention relates generally to oscillators and more particularly to crystal oscillators having both negative and positive feedback loops.

2. Discussion of Related Art

Many oscillator designs have been suggested in which a high Q, series resonant circuit, such as a piezoelectric crystal is used to produce frequency stability. Such oscillators are used as reference frequency generators in many applications. A primary consideration in these applications is that the oscillator output be stable against changes due to voltage, temperature and secular changes.

U.S. Pat. No. 3,996,530 to Feistel et al shows a Butler Oscillator having an amplitude limiting amplifier following a filter network interposed between the voltage amplification stage and the impedance matching stage in order to ensure that the crystal is driven by a sinusodial waveform, free of distortion, for maximum frequency stability.

U.S. Pat. No. 3,836,873 to Healey, III et al discloses a cascode amplifier configuration comprising first and second transistors in combination with inductance and capacitance elements to provide an oscillator configuration with phase shift in the vicinity of the oscillator frequency dominantly controlled by the quartz crystal unit motional impedance parameters.

U.S. Pat. No. 3,878,481 to Healey, III discloses a VHF oscillator circuit having first and second transistors, a first resonant circuit coupled to each of the collectors of the first and second transistors, and a transformer for coupling energy from the first resonant circuit in a manner that signals substantially equal in amplitude but opposite in phase are applied respectively to the bases of the first and second transistors. In addition, an anti-resonant circuit comprising a crystal unit is coupled to the emitter of the first transistor.

U.S. Pat. No. 3,569,865 to Healey III discloses a high stability voltage controlled oscillator having a series coupled emitter follower transistor amplifier with regenerative feedback to a tuned circuit coupled to the base electrode of the amplifier. The tuned circuit has a narrow pass band crystal filter in series with a variable capacitor and in parallel with a low Q inductor with a controlled voltage adapted to be coupled to the variable capacity device to vary the capacitive reactance of the tuned circuit to produce oscillation over a limited frequency range with high stability.

U.S. Pat. No. 3,571,754 to Healey III discloses a variable frequency harmonic oscillator including a voltage tunable crystal controlled resonator incorporating a quartz crystal unit with precisely anti-resonated static capacitance operating substantially at the series resonant frequency of the quartz as opposed to the anti-resonant frequency thereof and a voltage variable reactance network coupled thereto having a linear reactance vs. voltage characteristic.

U.S. Pat. No. 3,824,494 to Gerum discloses a crystal oscillator for use in clocks and watches.

U.S. Pat. No. 3,911,378 to Buchanan discloses a voltage controlled oscillator employing three series TTL inverting gates.

SUMMARY OF THE INVENTION

One object of the present invention is to provide a crystal oscillator having a negative feedback loop to stabilize the circuit against changes in sustaining amplifier characteristics due to voltage, temperature and secular changes.

Another object of the present invention is to provide a balanced feedback oscillator in which separate positive and negative feedback paths are utilized in order to provide very high ratios of operating Q to resonator Q; independent control of both output power and crystal dissipation; the ability to operate with high impedance resonators; and the elimination of separate mode traps, and overtone filters.

A still further object of the present invention is to provide a balanced feedback oscillator which produces an increase in short-term stability and a reduction in sideband phase noise when the product of amplifier gain and the negative feedback exceeds unity.

An even further object of the present invention is to provide an oscillator with superior automatic level control action.

Another object of the present invention is to provide an oscillator which achieves a reduction in the phase noise floor by independent control of the amplifier and crystal currents.

In accordance with the above and other objects, the present invention is an oscillator circuit comprising an amplifier having a positive feedback path, a negative feedback path and an output path. A series resonant circuit is connected in the negative feedback path and at least one impedance element is connected in the positive feedback path. The impedance element is adjusted to produce a feedback ratio sufficient to cause oscillation to occur at the resonant frequency of the series resonant circuit. The negative feedback path is separate from the output path such that the output power of the amplifier can be controlled independently of current in the negative feedback path.

In accordance with other aspects of the invention, the amplifier comprises a differential amplifier having an inverting input and a non-inverting input. The positive feedback path is connected to one of the inputs and the negative feedback path is connected to the other of the inputs.

The series resonant circuit of the oscillator can be a piezoelectric crystal. One side of the crystal can be connected to ground.

The oscillator circuit can also include a limiting circuit for varying the feedback ratio of the positive feedback path in response to an output level in the output path.

In accordance with other aspects, the present invention is an oscillator circuit which comprises a differential amplifier having an inverting input, a non-inverting input and an output. A positive feedback path produces a positive feedback ratio to one of the inputs and a negative feedback path produces a negative feedback ratio to the other of the inputs. The positive and negative feedback ratios are adjusted to produce oscillation at the resonant frequency of the resonant circuit.

BRIEF DESCRIPTION OF THE DRAWINGS

The above and other objects of the invention will become more readily apparent as the invention is more fully explained in the detailed description below, reference being had to the accompanying drawings in which like reference numerals represent like parts throughout, in which.

DETAILED DESCRIPTION OF THE PREFERRED EMBODIMENTS

Figure 1:
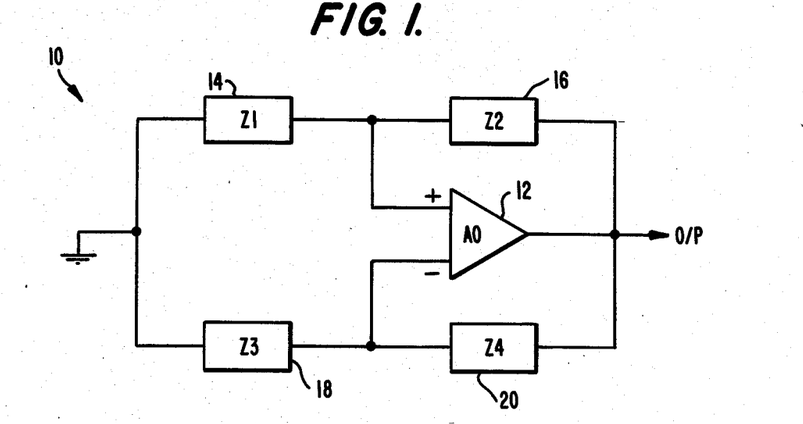
FIG. 1 is a schematic diagram of a bridge configuration which can be used to produce a balanced feedback oscillator according to the present invention.

FIG. 1 shows a bridge configuration 10 including a dual feedback network driving a differential amplifier 12 having a gain Ao. The output of the amplifier excites two feedback paths. One feedback path provides positive feedback through the voltage divider comprising impedances 14 and 16. One feedback path provides negative feedback through the divider comprising impedances 18 and 20. In order to produce oscillation at one frequency only, a resonator can be placed at any one of the four impedances and provide a net positive feedback at its resonant frequency. A series resonant circuit in place of the impedances 16 or 18, or an anti-resonant circuit in place of impedances 14 or 20 will produce the desired oscillation. This configuration produces a very rapid transfer from positive to negative feedback off resonance and a very high value of $d\phi/df$ around resonance, wherein $\phi$ represents phase and f represents frequency. The result is a multiplication of the resonantor's Q value and rapid reduction of the amplifier induced phase noise at the close-in sideband frequencies, as will be demonstrated hereinafter.

By way of background, the basic equation for feedback amplifiers is:

$$A = \frac{Ao}{1 - Ao\beta} \quad (1)$$

where: A is the closed loop gain in the presence of a feedback ratio $\beta$, and an amplifier gain of Ao.

In the balanced configuration shown, $\beta$ is divided between the two arms, $\beta n$ and $\beta p$ as follows:

$$\beta = \beta p - \beta n \quad (2)$$

$$\beta n = \frac{Z_3}{Z_3 + Z_4}, \beta p = \frac{Z_1}{Z_1 + Z_2} \quad (3),(4)$$

where: $Z_1 \ldots Z_4$ represent the impedances of element 14, 16, 18, 20, respectively.

Substituting these for $\beta$ in equation (1), yields:

$$A = \frac{Ao}{1 - Ao(\beta p - \beta n)} \quad (5)$$

For oscillation to occur: Ao must be real and positive, $\beta p - \beta n$ must be real and positive, and the denominator must be equal to zero. That is:

$$\beta p - \beta n = \frac{1}{Ao} \quad (6)$$

The arrangement of FIG. 1 can be used as a crystal oscillator if the crystal is used in its series resonant mode, and substituted for impedance 18. The crystal could also be used in its anti-resonant mode in place of impedance 14 or 20, but this requires impractically high values for impedance 16 or 18, to avoid excessive dampening of the crystal's Q and does not result in the same benefits that substituting the crystal for impedance 18 provides. Using the crystal as impedance 18 also produces a high loaded Q, plus a Q-multiplication factor.

The configuration of FIG. 1 permits the amplifier to operate with a high power output while still maintaining the crystal current at a relatively low value, as will be discussed. A high amplifier output is desirable in order to limit the phase-noise sidebands. The limiting factor in reducing phase-noise sidebands on conventional crystal oscillator signals is often the low power level at which most oscillators operate. The sideband noise generated within an oscillator is:

$$S\phi(f) = f_o^2(F_oKT)/(P_sQ^2f_m^2) + (AF_o^2)/(Q^2f_m^3) \quad (7)$$

where:
- $f_o$ is the resonant frequency;
- $F_o$ is the noise figure;
- K is Boltzmann's constant;
- T is the absolute temperature;
- $P_s$ is the power level;
- Q is the crystal selectivity;
- $f_m$ is the sideband frequency; and
- A is the flicker noise constant.

where the first term is the thermal noise contribution, and the second the flicker noise term. Both terms are reduced when high Q crystals are used, while the first term is also helped by generating a high power level $P_s$ in the oscillator circuit, along with a low noise figure $F_o$.

The first term produces a $1/f_m^2$ spectral slope while the second accounts for a $1/f_m^3$ spectral slope.

A following buffer amplifier can contribute:

$$S\phi(f) = (4F_AKT)/P_s + A/f_m \quad (8)$$

where $F_A$ is the buffer amplifier noise figure and where the first term is a flat thermal noise contribution, while the second adds a $1/f_m$ flicker noise spectrum. Here again the first (thermal) term is reduced if the signal level is high.

This analysis indicates the advantages of generating a high output level directly from the oscillator rather than depending on a buffer amplifier to provide power. There can also be a reduction in the number of stages required. A good isolation amplifier may still be required to reduce load reaction on the oscillator.

A review of the classic Pierce/Colpitts oscillators will show a conflict between the requirements for low crystal current, and optimum transistor current.

It is generally considered desirable to hold the crystal current at a low value, typically 1 mA or less, in order to reduce short- and long-term variations in frequency. However, the classic oscillators generate an a.c. collector current that is less than the crystal current by a factor proportional to circuit Q, which is usually between 2 and 10.

If the oscillator is self-limiting, the d.c. collector current is typically between 0.5 and 1 times the a.c. current. One thus ends up with a d.c. collector current in the order of 50 to 500 microamperes. If an automatic level control (ALC) circuit is used that operates on the transconductance of the sustaining amplifier (and this is the usual case) then the d.c. current is usually at, or below, the lower end of that range. An examination of noise figures, and gain-bandwidth products ($f_T$) for low noise rf transistors indicate that the best units have minimum noise figures and maximum $f_T$ in the range of 0.5 to 3 mAdc (with higher power units to 15 mA). Thus the two goals indicated above are not compatible in the classic oscillators unless ALC is achieved through a variable attenuator in the feedback path so that an optimum d.c. current can be maintained.

Negative feedback may be used to increase the effective Q of a crystal by providing a multiplier effect as demonstrated by the following discussion.

The rate at which phase changes in an oscillator circuit is dependent on the loaded Q of the crystal. In most oscillator circuits this is less than the Q of the resonator alone, varying from 50% to 90%. By considering the impedance of the crystal in the vicinity of series resonance, we can derive the $d\phi/df$ of the crystal alone, since:

$$Z = R + j\frac{\omega^2 LC - 1}{\omega C} \tag{9}$$

where:
R is the crystal resistance;
L is the crystal inductance;
C is the crystal capacitance;
$\omega$ is the angular frequency.

$$\phi = \arctan \frac{\omega^2 LC - 1}{\omega CR} \tag{10}$$

Since Q is defined as:

$$Q = \frac{1}{\omega CR} \tag{11}$$

then $\phi = \arctan Q(\omega^2 LC - 1)$ \hfill (12)

$$\text{and } \frac{d\phi}{d\omega} = \frac{2Q\omega LC}{(1 + (\omega^2 LC - 1)Q)} \tag{13}$$

At the resonant frequency:

$$\omega_o^2 LC = 1 \tag{14}$$

where: $\omega_o$ is the resonant angular frequency $$\text{thus, } \frac{d\phi}{d\omega} = 2Q\omega_o LC \tag{15}$$

$$\text{or } \frac{d\phi}{d\omega} = \frac{2Q}{\omega_o} \tag{16}$$

$$\text{or } \frac{d\phi}{df} = \frac{2Q}{f_o} \left(\frac{rad}{Hz}\right) \tag{17}$$

Thus the Q of the resonator determines the rate of change of phase and in turn, the sideband phase noise decay rate.

In calculating the $d\phi/d\omega$ rate for a dual feedback oscillator in which the crystal is in the negative feedback path, assume that $\beta p$ is a constant, while $\beta n$ is proportional to the crystal impedance, so that:

$$Ao = \frac{1}{\beta p - K\left(R + \frac{j(\omega^2 LC - 1)}{\omega C}\right)} \tag{18}$$

where: K is the negative feedback factor.

Then:

$$\phi = \arctan \frac{K\omega(\omega^2 LC - 1)}{\omega C (\beta p - KR)} \tag{19}$$

Differentiating, and setting $\omega^2 LC = 1$ at $\omega = \omega_o$ $$\frac{d\phi}{d\omega} = \frac{2K}{\omega_o^2 C(\beta p - Kr)} \tag{20}$$

substituting $Q = \frac{1}{\omega_o CR}$, $$\frac{d\phi}{d\omega} = \frac{2Q}{\omega_o} \times \frac{\beta n}{\beta p - \beta n}, \tag{21}$$

$$\frac{d\phi}{d\omega} = \frac{2Q}{\omega o} \times \beta n Ao, \tag{22}$$

Since $Ao = \frac{1}{\beta p - \beta n}$, then $$\frac{d\phi}{d\omega} = \frac{2Q}{\omega_o} \times \beta n Ao = \frac{2Q}{\omega_o} \times M_Q \tag{23}$$

where: $M_Q$ is the Q multiplication factor. Thus the Q is multiplied by the factor $\beta n Ao$. Even though we cannot change the crystal's Q, we can theoretically multiply its effect on $d\phi/d\omega$ with combined positive and negative feedback in which the negative loop includes the crystal.

Figure 2:
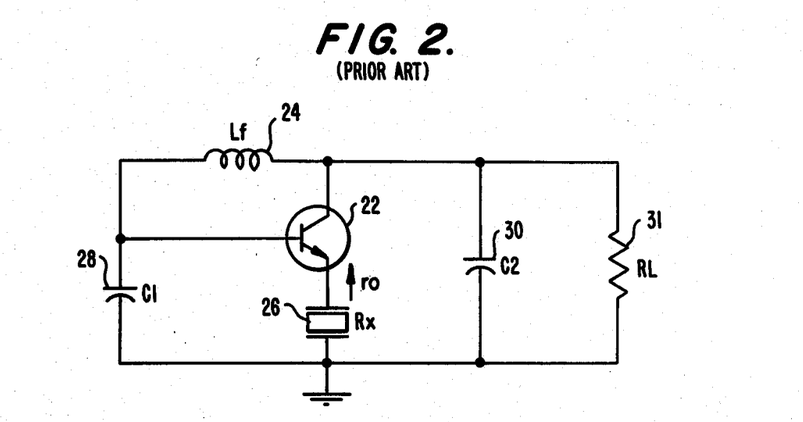
FIG. 2 shows a prior art Butler Oscillator having both positive and negative feedback.

The common Butler Oscillator, uses both positive and negative feedback. As shown in FIG. 2, this oscillator comprises a transistor 22 having an inductor 24 connected between its collector and base. A crystal 26 is connected between the transistor emitter and ground. A capacitor 28 is connected between the transistor base and ground. A second capacitor 30 and the load 31 are connected from the transistor collector to ground. This class of oscillators can be considered as a dual feedback design since the crystal 26 is in series with the emitter of the sustaining amplifier 22, providing negative feedback, while the capacitive voltage divider 28, 30 across the output tank, provides positive feedback.

The factors, Ao, $\beta p$ and $\beta n$ for the Butler Oscillator can be determined as follows:

$$Ao = \frac{RL}{re}, \tag{24}$$

where:

RL is the resistance of load 31; and
re is the emitter resistance of transistor 22 and is equal to $0.026/I_E$, $$\beta_p = \frac{C_2}{C_1} \quad (25)$$

where:
C$_2$ is the capacitance of capacitor 30; and
C$_1$ is the capacitance of capacitor 28, $$\beta_n = \frac{R_X}{R_L} \quad (26)$$

where: $R_X$ is the resistance of crystal 26.

The Q multiplication factor is, as before, $$M_Q = \frac{\beta_n}{\beta_p - \beta_n} = \beta_n A_o. \quad (27)$$

The Q-factor is not realized in practice unless Ao is maintained at a high value. This does not occur when $\beta_p$ is made much larger than $\beta_n$, as is the usual practice, since limiting, or ALC, will reduce Ao until:

$$A_o = \frac{1}{\beta_p - \beta_n} \quad (28)$$

If $\beta p >> \beta n$, than Ao drops to a low value, greatly reducing the Q-factor.

The benefits of Q multiplication cannot be realized then, unless $\beta p - \beta n$ is maintained at a low value commensurate with the available value of 1/Ao. Applied to FIG. 2:

$$M_Q = \frac{R_X}{re} \quad (29)$$

This is the factor through which the gain is reduced by the presence of the crystal's resistance in the emitter circuit.

As an example of the magnitude of $M_Q$, assume re=15, $R_X$=50, $R_L$=1500 then Ao=100, $\beta n$=0.033 and $\beta p$=(1/100)+0.033, resulting in $M_Q = \beta n A_o = 0.033 \times 100 = 3.3$. This represents an effective increase in ($d\phi/df$) over that produced in a conventional single-feedback oscillator, such as the Pierce, or Colpitts types, even though the full benefits of Q multiplication are not produced.

Figure 3:
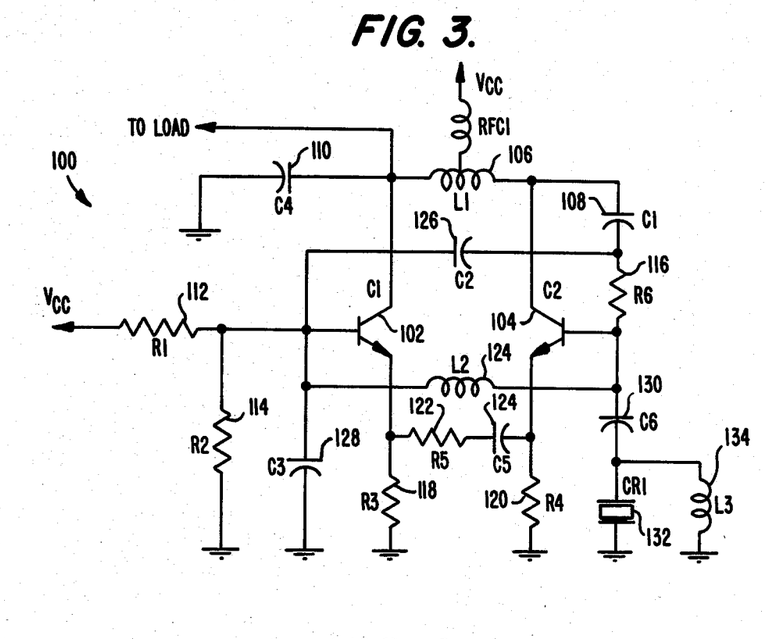
FIG. 3 is a schematic diagram showing one embodiment of the present invention.

Referring to FIG. 3, the basic oscillator 100 of the present invention is shown. This oscillator is referred to as a differential crystal oscillator (DXO). The DXO uses a differentially connected transistor pair 102 and 104 providing separate inputs for positive and negative feedback networks. The oscillator is tuned by an L-C circuit comprising inductor 106, capacitor 110 connected from the collector of transistor 102 to ground, and the series connection of capacitors 108, 126 and 128 between the collector of transistor 104 and ground. The value of capacitor 110 equals the sum of capacitors 108, 126 and 128 so that the tuned circuit is balanced relative to transistors 102 and 104. The oscillator 100 is biased as a linear amplifier by a resistive voltage divider comprising the resistors 112 and 114 connected to the bases of the transistors, and by separate emitter resistors 118 and 120. The emitter resistors provide for small differences between the transistors and prevent either transistor from being cut off. The transistor emitters are connected by a resistor 122 and a capacitor 124, which effectively tie the emitters together for a.c. operation. An inductor 124 is connected between the transistor bases to equalize the current between the bases. Capacitor 126 is connected between the base of transistor 102 and the junction of capacitor 108 with resistor 116. Capacitor 128 is connected between the base of transistor 102 and ground. A capacitor 130 is connected between the base of transistor 104 and one side of a crystal 132. The other side of crystal 132 is connected to ground. An inductor 134 is connected in parallel with crystal 132. The purpose of capacitor 130 is to aid in the tuning of crystal 132 and to block d.c. signals. Inductor 134 provides a d.c. to ground shunt around crystal 132 to eliminate any d.c. voltage across the crystal.

The operation of DXO 100 can be understood more easily by considering the circuit with the crystal 132 not present and an a.c. short to ground placed on the base of transistor 104. The circuit will oscillate at the resonant frequency of the L-C collector circuit or "tank" circuit. This occurs because of the positive feedback from the collector of transistor 104 to the base of transistor 102 through the voltage divider formed by capacitors 108, 126 and 128. The voltage across capacitor 128 is a fraction of the collector voltage of transistor 104 but is large enough to sustain oscillation.

If we assume that the short to ground is now removed from the base of transistor 104, the circuit will stop oscillation because of strong negative feedback produced by the connection between the tuned circuit and the base of transistor 104 by resistor 116. With the crystal disconnected, the voltage at the junction of capacitors 108 and 126 exceeds that at the junction of capacitors 126 and 128, and therefore, feedback equation (4) above has a large positive denominator and the circuit provides little overall gain.

Finally, by connecting a crystal resonator 132 to ground as shown in FIG. 3, the circuit will oscillate if the series resonance of the crystal is within the bandpass of the tuned circuit, and is low enough in resonant resistance to reduce the $\beta n$ to the point where equation (5) is satisfied.

The DXO 100 is capable of generating a very high ratio of output power to crystal power dissipation, typically ratios of more than 100 (40 db) are achievable, because the current through crystal 132 is dependent neither on the output level of the oscillator nor on the current level in the positive feedback path. Thus the requirement for a low crystal current can be met while maintaining a high value for Ao so that the thermal noise component is reduced and a high Q multiplication factor is achieved. Experiments with the DXO 100 indicate that if it is designed for a high power output to crystal dissipation ratio, it can present a signal sufficiently above the noise level of the following stages to greatly reduce the added noise.

Thus, the DXO 100 is capable of achieving a high Q multiplier effect as defined by equation 23 so that the circuit Q is above the crystal Q and is also capable of achieving a high power output so that the noise of the final signal is significantly reduced. This is due to the fact that the negative feedback path is separate both from the positive feedback path and the output circuit. Thus, the current in the crystal 132 can be precisely controlled independently of the power output of the amplifier and the current in the positive feedback path. This not only results in a high Q multiplier and low thermal noise, but also permits a high impedance crystal to be used.

It will be understood that maintaining positive and negative feedback paths separate permits the sustaining differential amplifier to operate with a high gain Ao to achieve a high Q multiplication factor. Keeping the negative feedback path containing the crystal separate from the output path permits the output signal to be large thus eliminating the need for additional signal amplification and the addition of noise. DXO 100 can be modified for other purposes whereby only one of these advantages may be achieved. For example, rather than connecting the lower lead of crystal 132 directly to ground, the oscillator output might be taken from this lead to provide a signal with less noise since the current only flows through the crystal within its narrow pass band. This signal would be provided to a common base amplifier having a low input impedance. This configuration would have a high Q multiplier but would require a following amplifier.

The basic principles of the DXO can be implemented by using a differential integrated circuit R.F. amplifier such as CA3001, CA3040, or the MC1733. These amplifiers exhibit voltage gain values from 10 to 400 and a bandwidth of up to 50 $\mu$Hz without L-C circuits, so that an essentially aperiodic oscillator can be built with them. The basic circuit for this configuration is shown in FIG. 4.

Figure 4:
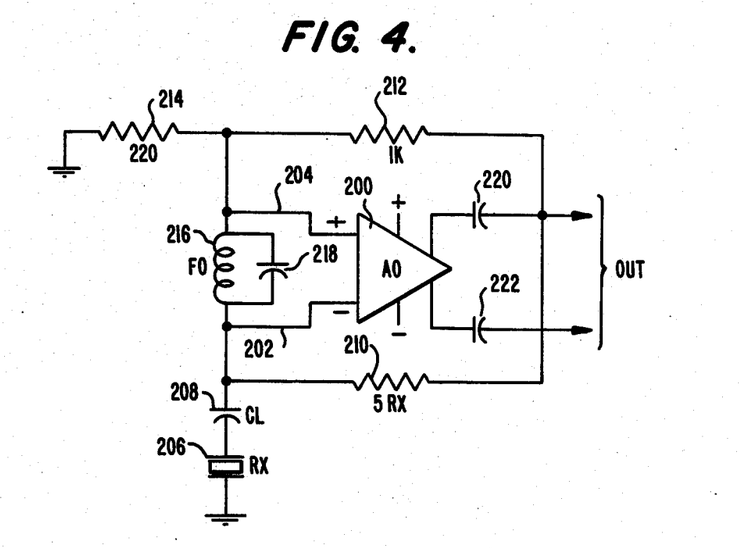
FIG. 4 is a second embodiment of the invention implemented using an integrated circuit differential amplifier.

The circuit of FIG. 4 comprises a differential amplifier 200 having a gain Ao and inverting and non-inverting inputs 202 and 204. A crystal 206 has one terminal connected to ground and the other terminal connected to the inverting input 202 through a capacitor 208. Negative feedback is generated by a resistor 210 having a value of 5 times of the crystal resistance RX. Positive feedback is generated by a voltage divider consisting of resistors 212 and 214 connected from the amplifier output to the non-inverting input of the amplifier. A resonant circuit comprising inductor 216 and capacitor 218 is connected between the inverting and non-inverting inputs 204 and 208. The output of amplifier 200 is d.c. blocked by capacitors 220 and 222. MOS I.C. differential amplifiers such as amplifier 200 have a very low output impedance and can drive low resistances as low as 500 ohms. This allows the use of resistors 210, 212 and 214 in the feedback networks, as shown, and, when combined with a dual voltage supply, the circuit is very simple. The only adjustment, once the positive feedback ratio and the amplifier gain are selected, is to pick a resistor for feeding the crystal so that the proper value for the negative feedback ratio can be obtained. It is a simple matter to adjust this value to compensate for the variation in the crystal's series resistance so that a large amount of excess gain is not produced.

Figure 5:
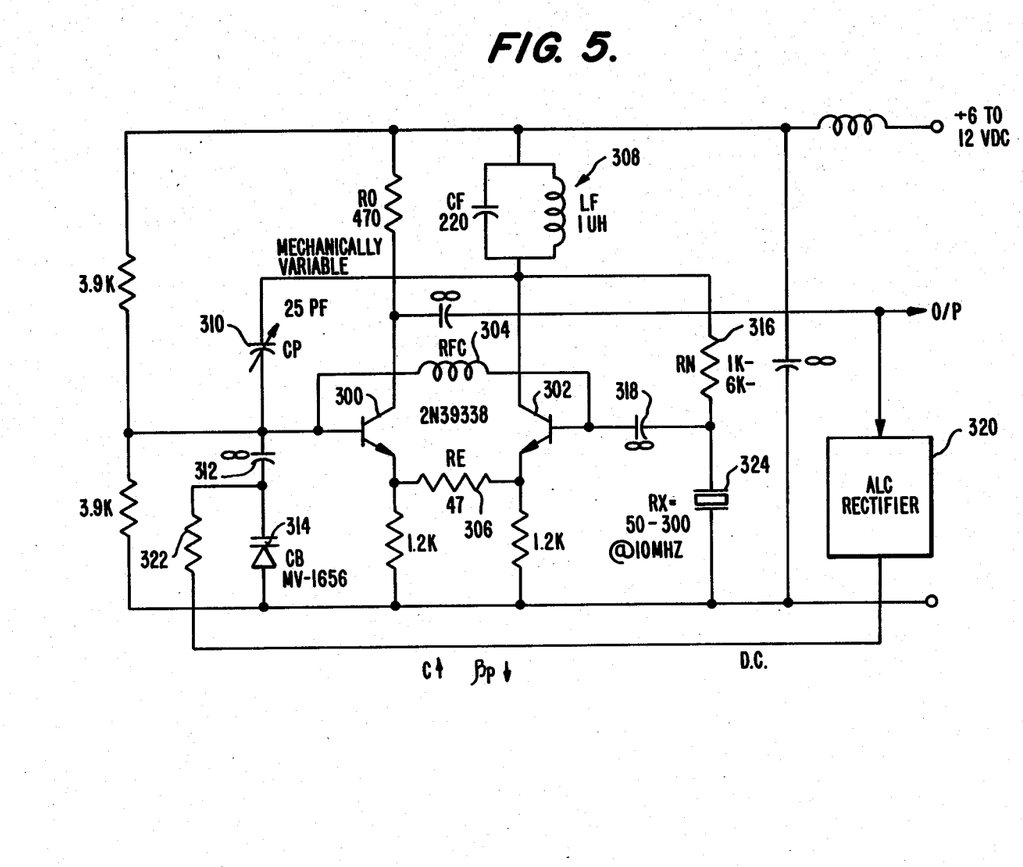
FIG. 5 is a schematic diagram showing an embodiment of the present invention using automatic level control.

A design incorporating amplitude limiting is shown in FIG. 5. This circuit is essentially the same as shown in FIG. 3 and comprises transistors 300 and 302 interconnected by an inductor 304 for providing equal DC bias to the bases of the transistors. The transistor emitters are connected by a resistor 306 and a resonant circuit 308 is connected between the transistor collectors. Positive feedback is provided through a divider comprising capacitor 310, capacitor 312, and variable capacitor 314. Negtive feedback is provided through a resistor 316 and a DC blocking capacitor 318. An automatic level control circuit 320 is connected between the output of the oscillator and the junction between capacitors 312 and 314 through a resistor 322. A crystal 324 is connected between the base of transistor 302 and ground.

The circuit of FIG. 5 provides positive feedback through the capacitive divider 310, 312, 314 to one base and negative feedback through a divider comprising resistor 316 and crystal 324 to the other base. The result is an L-C oscillator constrained by the crystal circuit to oscillate only at the series resonant frequency of the crystal. The L/C ratio can be selected to provide a wide range of bandwidths. A low L/C ratio will produce a narrow bandwidth suitable for use with SC-cut and/or overtone mode crystal operation. Higher L/C ratios can be used for the less critical fundamental modes. It is worth noting that the tuned circuit is loaded by the $\beta$n resistance at $\omega_0$ and is loaded only by $R_n$ plus the input impedance of the transistor at frequencies immediately off resonance.

An alternate method of obtaining an output signal is to connect the input of a common base amplifier in series with the lower terminal of the crystal. Since current only flows through the crystal within its narrow pass bands, the output will contain less noise than the collector resistor connector, and will be sinusoidal in shape. As discussed above, however, signal level at the output will be lower so that more noise may be added by the series connected amplifier.

The ALC circuit 320 feeds back a level control signal indicative of the output signal amplitude. This level control signal is a d.c. signal and is provided through resistor 322 to alter the positive feedback ratio at the base of transistor 300. Level control circuits themselves are known and circuit 320 will not be described in detail. Such a circuit can comprise a rectifier or any similar circuit for providing a d.c. output which is indicative of the amplitude of an a.c. input signal. Capacitor 314 is an electronically variable capacitor whose capacitance is a function of the d.c. current applied thereto. Capacitor 310 blocks all d.c. signals except those from ALC circuit 320 so that the capacitor 314 responds directly to the level control signal. As the amplitude of the oscillator output signal increases, the capacitance of capacitor 314 increases due to an increase in the gain control signal. This causes a reduction in the positive feedback ratio $\beta$p and stabilizes the output signal level. The significant feature of the invention in this regard is that the current through the crystal is not affected as would be the case if ALC is used in the circuit of FIG. 2 where the transconductance of the amplifier would be changed.

As will be understood from the foregoing discussion, the present invention provides an oscillator wherein the current through the crystal contained in the negative feedback loop can be set independently of the output power of the oscillator. This permits low crystal current and high crystal resistance to be used without affecting the output level. The balanced circuit also produces soft limiting with even order harmonic cancellation. Limiting occurs first in the positively driven transistor and since amplifier gain is inversely proportional to the difference between positive and negative feedback, only a slight reduction of positive feedback is necessary to stabilize the amplitude.

No additional overtone or mode traps are required. A single tuned circuit confines the oscillation to the selected frequency band.

Dual mode operation is also very convenient with the invention. In dual mode operation, one resonator can be run on two of its modes or overtones simultaneously.

Since the crystal is grounded at one terminal and operates in the series mode, two oscillators can be tied to one resonator with crossover filters on either side to separate the mode currents. Such a configuration is shown schematically in FIG. 6 wherein two crossover networks 400 and 402 are connected between the resonator 404 and two DXO circuits 406 and 408. Each network 400, 402 presents a series-resonant pole between the resonator and its DXO, and also an anti-resonant pole to the frequency of the other DXO. In addition, loading capacitors can be used to trim each mode independently.

Figure 6:
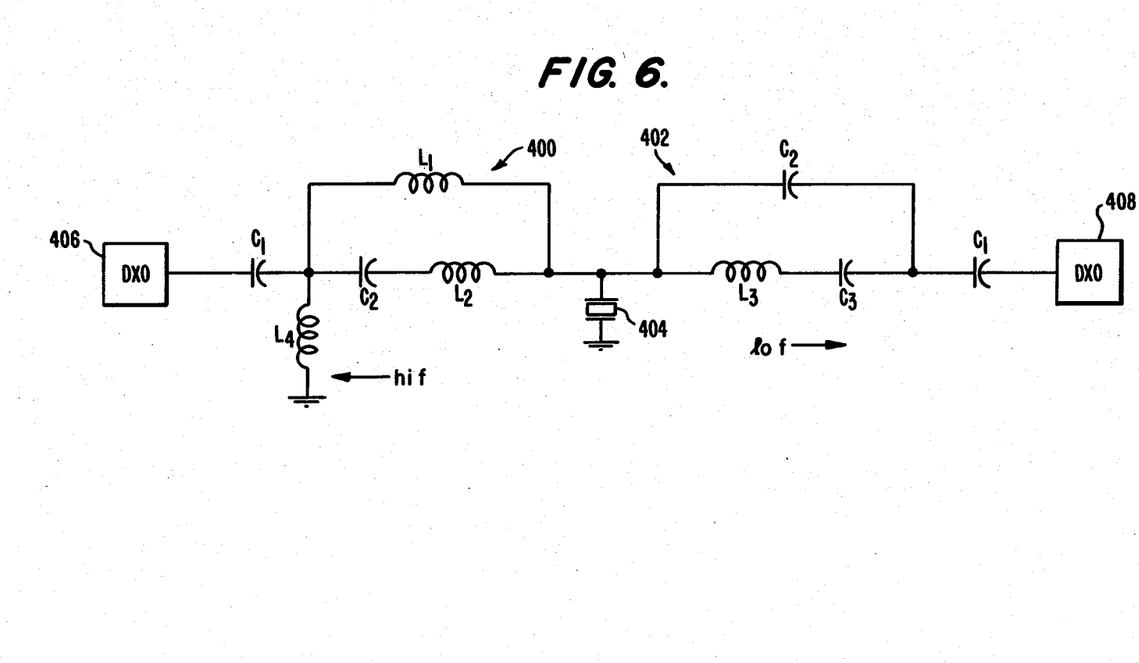
FIG. 6 is a schematic diagram showing dual mode operation using the present invention.

The most important concern is the need for high Q inductors in these networks, since the equivalent series resistance of the series inductance adds to the resistance of the crystal and reduces its operating Q. The shunt "anti-resonant" reactances must also exhibit high Q to provide a rapid transition from low impedance (pass) to high impedance (reject).

Grounded, series mode crystal operation is also usable when several crystals are being switched into one oscillator, or when the crystal is on long leads, e.g., one being used as a transducer.

The foregoing description is set forth for purposes of illustrating the invention but is not deemed to limit its scope. Clearly, numerous additions, substitutions and other modifications could be made without departing from the scope thereof as set forth in the appended claims.

What is claimed is:

1. An oscillator circuit comprising:
   a differential amplifier having an inverting input and a non-inverting input and having a positive feedback path connected to one of said inputs, a negative feedback path connected to the other of said inputs, and an output path;
   a series resonant circuit connected in said negative feedback path; and
   at least one impedance element in said positive feedback path for establishing a feedback ratio sufficient to cause oscillation to occur at the resonant frequency of said series resonant circuit;
   wherein the negative feedback path is separate from said output path such that the output power of said amplifier can be controlled independently of current in said negative feedback path.

2. An oscillator circuit as claimed in claim 1 wherein said series resonant circuit comprises a piezoelectric crystal.

3. An oscillator circuit as claimed in claim 2 wherein said crystal has one side connected directly to ground.

4. An oscillator circuit as claimed in claim 3 wherein said crystal has another side connected to said other input of said differential amplifier.

5. An oscillator circuit as claimed in claim 1 further including limiting circuit means for varying the feedback ratio of said positive feedback path in response to an output level of said output path.

6. An oscillator circuit, comprising:
   a differential amplifier having an inverting input and a non-inverting input having:
   a positive feedback path producing a positive feedback ratio to one of said inputs; and
   a negative feedback path including a series resonant circuit producing a negative feedback ratio to the other of said inputs;
   wherein said positive and negative feedback paths are independent such that the current in each of said paths can be adjusted independently, said paths being adjusted to produce oscillation at the resonant frequency of said resonant circuit.

7. An oscillator as claimed in claim 6 wherein said series resonant circuit is a piezoelectric crystal.

8. An oscillator circuit as claimed in claim 7 wherein said piezoelectric crystal has a pair of leads, one of said leads being connected to ground.

9. An oscillator circuit as claimed in claim 6 wherein said differential amplifier comprises two transistors having respective collectors, and a resonant circuit connected between said collectors.

10. An oscillator circuit as claimed in claim 6 wherein said positive feedback path comprises a capacitive divider connected between said output and said non-inverting input.

11. An oscillator circuit as claimed in claim 10 wherein said negative feedback path includes a divider comprising a resistance and said series resonant circuit connected between said output and said inverting input.

12. An oscillator circuit as claimed in claim 6 wherein said differential amplifier comprises a pair of transistors and an inductor connecting bases of said transistors together.

13. An oscillator circuit as claimed in claim 6 and further including an amplitude limiting control circuit for controlling the positive feedback ratio in response to the amplitude of a signal on said output.

14. An oscillator circuit as claimed in claim 13 wherein said limiting control circuit comprises a variable capacitor in said positive feedback path and means to vary the capacitance of said capacitor depending upon the output of said amplifier.

15. An oscillator circuit as claimed in claim 6 wherein said differential amplifier is an integrated circuit differential amplifier.

16. An oscillator circuit as claimed in claim 15 wherein said integrated circuit differential amplifier has a low impedance output and said positive feedback path comprises a resistive voltage divider connected between said output and said non-inverting input.

17. An oscillator circuit as claimed in claim 16 wherein said series resonant circuit comprises a piezoelectric crystal.

18. An oscillator circuit as claimed in claim 15 further including a second resonant circuit connected between said inverting and non-inverting inputs.

* * * * *